United States Patent
Norberg et al.

(10) Patent No.: US 9,343,869 B1
(45) Date of Patent: May 17, 2016

(54) MODE-HOP TOLERANT SEMICONDUCTOR LASER DESIGN

(71) Applicant: Aurrion, Inc., Goleta, CA (US)

(72) Inventors: Erik Norberg, Santa Barbara, CA (US); Brian R. Koch, San Carlos, CA (US); Gregory Alan Fish, Santa Barbara, CA (US)

(73) Assignee: Aurrion, Inc., Goleta, CA (US)

( * ) Notice: Subject to any disclaimer, the term of this patent is extended or adjusted under 35 U.S.C. 154(b) by 0 days.

(21) Appl. No.: 14/830,961

(22) Filed: Aug. 20, 2015

Related U.S. Application Data

(63) Continuation of application No. 14/611,365, filed on Feb. 2, 2015, now Pat. No. 9,136,666.

(60) Provisional application No. 61/936,174, filed on Feb. 5, 2014.

(51) Int. Cl.

| | |
|---|---|
| *H01S 3/04* | (2006.01) |
| *H01S 3/137* | (2006.01) |
| *H01S 3/08* | (2006.01) |
| *H01S 3/106* | (2006.01) |
| *H01S 5/024* | (2006.01) |
| *H01S 3/136* | (2006.01) |
| *H01S 5/0687* | (2006.01) |
| *H01S 5/065* | (2006.01) |
| *H01S 5/0625* | (2006.01) |
| *H01S 5/125* | (2006.01) |

(52) U.S. Cl.
CPC ............. *H01S 3/137* (2013.01); *H01S 3/08059* (2013.01); *H01S 3/106* (2013.01); *H01S 3/1061* (2013.01); *H01S 3/136* (2013.01); *H01S 5/02407* (2013.01); *H01S 5/02446* (2013.01); *H01S 5/0653* (2013.01); *H01S 5/0654* (2013.01); *H01S 5/0687* (2013.01); *H01S 5/06256* (2013.01); *H01S 5/125* (2013.01)

(58) Field of Classification Search
CPC ....... H01S 3/137; H01S 3/136; H01S 3/1601; H01S 3/106; H01S 5/0687; H01S 5/0654; H01S 5/0653; H01S 5/06256; H01S 5/125
USPC .................. 372/32, 29.02, 102, 99, 98, 34
See application file for complete search history.

(56) References Cited

U.S. PATENT DOCUMENTS

| 5,043,991 A * | 8/1991 | Bradley | ................. H01S 5/125 372/32 |
|---|---|---|---|
| 2004/0126052 A1* | 7/2004 | Kamei | ............... G02B 6/12011 385/14 |
| 2008/0089369 A1* | 4/2008 | Luo | ..................... H01S 3/10092 372/28 |

*Primary Examiner* — Kinam Park
(74) *Attorney, Agent, or Firm* — Schwegman Lundberg & Woessner, P.A.

(57) ABSTRACT

Described herein are methods, systems, and apparatuses to utilize a laser device comprising a gain section, a wavelength filter, a first reflector, and a second reflector to form a laser cavity with the first reflector, the laser cavity to include the gain section and the wavelength filter. The wavelength filter is temperature stabilized to a predetermined temperature range and the remaining portions of the laser cavity are not temperature stabilized. The wavelength filter, when at the predetermined temperature range, comprises a plurality of adjacent longitudinal modes such that a difference in modal gain values associated with each of the adjacent longitudinal modes is within a predetermined delta. Thus, the cavity of the laser device is designed to experience some mode hops when the device temperature changes; however, because the wavelength filter is stabilized in temperature, the cavity drift due to these mode hops is within a limited range.

20 Claims, 5 Drawing Sheets

MODE-HOP TOLERANT SEMICONDUCTOR LASER DESIGN

CROSS-REFERENCE TO RELATED APPLICATIONS

This application is a continuation of U.S. application Ser. No. 14/611,365, filed Feb. 2, 2015, now issued as U.S. Pat. No. 9,136,666, which in turn claims the benefit of priority to U.S. Provisional Patent Application entitled "MODE-HOP TOLERANT SEMICONDUCTOR LASER DESIGN," Ser. No. 61/936,174, filed Feb. 5, 2014, both of which are hereby incorporated herein by reference in their entireties.

FIELD

Embodiments generally pertain to optical devices and more specifically to semiconductor laser cavity design.

BACKGROUND

For wavelength division multiplexing (WDM) transmitters operating over wide temperature ranges, the output wavelength of a transmitter's lasing device can change in response to temperature changes. This change in the lasing device's output wavelength can introduce cross-talk between wavelength channels and/or result in lost data at a WDM receiver. Current solutions stabilize the operating temperature of the entire lasing device, but these solutions are not power efficient in controlling the output wavelength of the lasing device.

BRIEF DESCRIPTION OF THE DRAWINGS

The following description includes discussions of figures having illustrations given by way of example of implementations and embodiments of the subject matter disclosed herein. The drawings should be understood by way of example, and not by way of limitation. As used herein, references to one or more "embodiments" are to be understood as describing a particular feature, structure, or characteristic included in at least one implementation of the disclosure. Thus, phrases such as "in one embodiment" or "in an alternate embodiment" appearing herein describe various embodiments and implementations of the disclosure, and do not necessarily all refer to the same embodiment. However, such phrases are also not necessarily mutually exclusive.

Descriptions of certain details and implementations follow, including a description of the figures, which may depict some or all of the embodiments described below, as well as a description of other potential embodiments or implementations of the concepts presented herein. An overview of embodiments is provided below, followed by a more detailed description with reference to the drawings.

DESCRIPTION

Embodiments of the disclosure describe mode-hop tolerant semiconductor laser cavity designs. Throughout this specification, several terms of art are used. These terms are to take on their ordinary meaning in the art from which they come, unless specifically defined herein or unless the context of their use would clearly suggest otherwise. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects of the disclosure.

Figure 1:
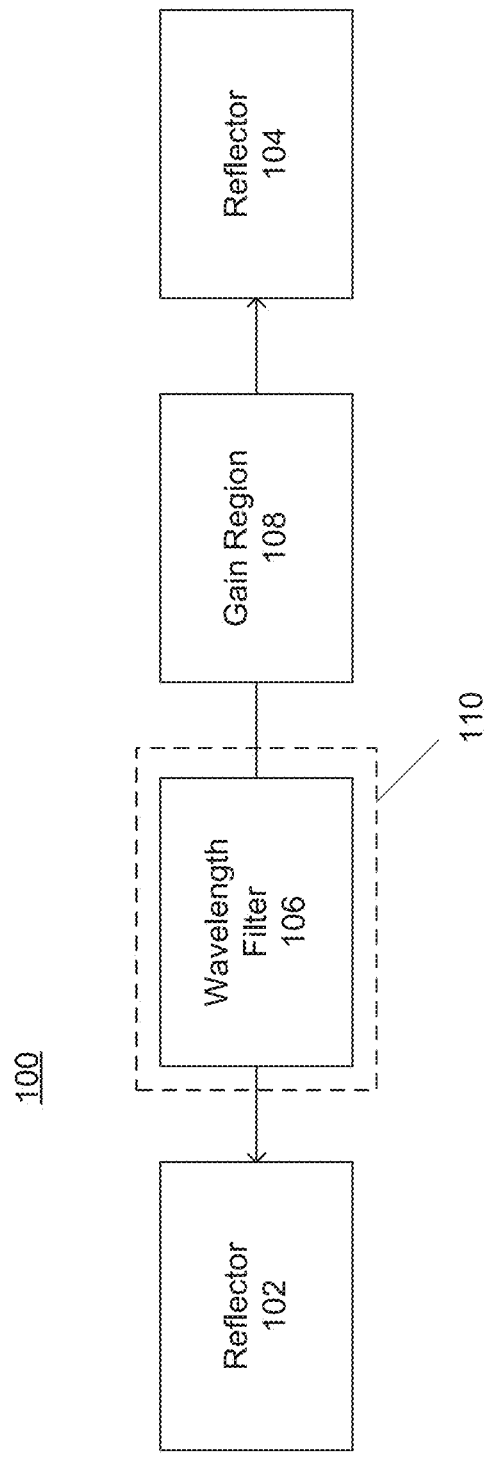
FIG. 1 is a block diagram of a lasing cavity of a device according to an embodiment of the disclosure.

FIG. 1 is a block diagram of a lasing cavity of a device according to an embodiment of the disclosure. In this embodiment, a device is shown to include a lasing cavity 100 formed by reflectors 102 and 104. Within the lasing cavity 100 is a wavelength filter 106 and a gain region 108. The wavelength filter 106 is understood as the element(s) that achieves the wavelength selection in the lasing cavity 100—in other embodiments, a wavelength filtering element can be included in one of the reflectors 102 and 104. Examples of the types of filters for the wavelength filter 106 include gratings, rings, asymmetric MZIs, directional couplers or combinations thereof.

For wavelength division multiplexing (WDM) systems operating over wide temperature ranges, the output wavelength of a laser device can change with temperature; this can introduce cross-talk between channels and/or result in lost data at a WDM receiver. Prior art solutions either stabilize the temperature of the entire laser chip using a thermo-electric cooler or utilize a local micro-heater(s) on the laser chip to compensate for temperature changes and stabilize the cavity mode group delay; however, these solutions are not power efficient, as the thermal mass of the entire laser cavity is being stabilized in these solutions.

In contrast to these solutions, embodiments of the disclosure describe a design for a lasing cavity, such as the lasing cavity 100, wherein the internal cavity wavelength filter(s) (e.g., the wavelength filter 106) is temperature stabilized, while the rest of the lasing cavity 100 is not temperature stabilized over the entire temperature operational range of the device. In the illustrated embodiment of FIG. 1, the region 110 including the wavelength filter 106 may be actively temperature stabilized using any temperature controlling device (e.g., thermo-electric coolers, microheaters, etc.), or the wavelength filter 106 may be passively stabilized by design.

Figure 2:
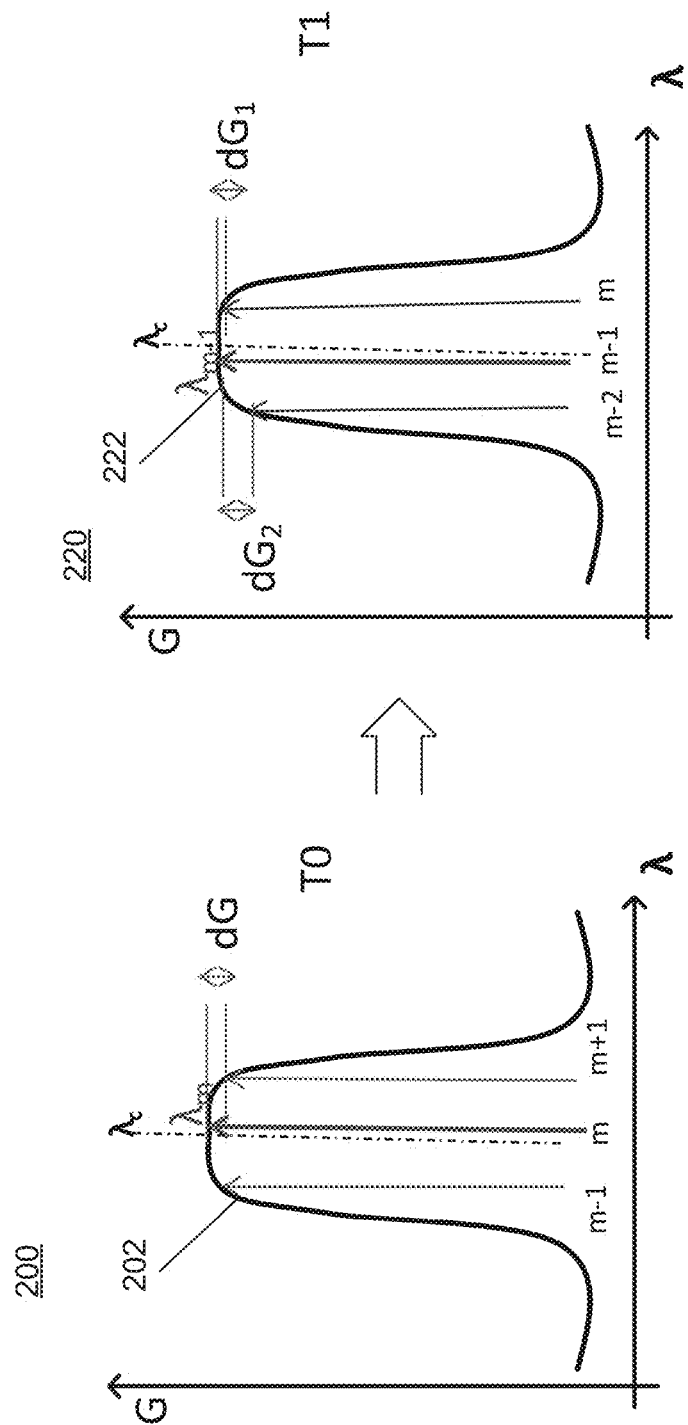
FIG. 2 illustrates a cavity mode drift for a lasing cavity according to an embodiment of the disclosure.

As the temperature of the device varies, the cavity mode of the lasing cavity 100 may drift relative to the stable wavelength filter 106; thus a mode-transition may take place as the threshold modal loss of a neighboring cavity mode becomes smaller than the current laser mode. In other words, the lasing cavity 100 is designed to allow the cavity to experience some mode hops when the device temperature changes; however, because the filter 106 is stabilized, the cavity drift due to these mode hops is within a limited range. FIG. 2 illustrates a cavity mode drift for the lasing cavity 100 of FIG. 1 according to an embodiment of the disclosure. The graphs 200 and 220 of FIG. 2 illustrate an exemplary mode hop from time T0 to time T1.

In this embodiment, a graph 200 is illustrated as a wavelength (x-axis)/modal gain (y-axis) plot. As referred to herein, the term "modal gain" describes the cavity roundtrip modal transfer function (i.e. the mode experiences both gain (from the gain region 108) and loss (from the wavelength filter 106 and each of the reflectors 102 and 104). Due to the design of the lasing cavity 100, the frequency of the laser output light may vary relative to the nominal center frequency by +−FSR/2 (FSR is the cavity mode full spectral range), as the cavity mode is not stabilized outside of region; however, in some embodiments the lasing cavity FSR is in the few-50 GHz range, and is thus applicable to most WDM systems.

The graph 200 is shown to include a curve 202 at time T0 representing a local transfer function for the lasing cavity 100 of FIG. 1 achieved through the utilization of the wavelength filter 106, wherein λc comprises the center wavelength of the filter 106. In one embodiment, the temperature stable wavelength filter 106 is designed to have a relatively flat wavelength response over a frequency range that corresponds to a few FSRs of the lasing cavity 100, as shown by the curve 202 of the graph 200. The curve 202 illustrates that the wavelength filter 106, when at predetermined temperature value controlled within the region 110, comprises a plurality of adjacent longitudinal modes (m−1, m, and m+1) such that the modal gain during a mode transition is within a predetermined delta (illustrated in the graph 200 as dG—delta modal gain minus loss at threshold). In some embodiments, known gain fluctuations resulting from a mode transition can be compensated via control of the gain region 108. As shown in this illustration, the wavelength for mode m (λm) is closely aligned with the center wavelength (λc) of the filter 106.

In other words, the filter 106 is selected such that the dG between the lasing mode m and its neighboring/adjacent modes m−1 and m+1 is designed to be small (in this embodiment, the wavelength filter transfer function is assumed to vary the sharpest in wavelength/frequency). In some embodiments, the dG between adjacent modes can also be adjusted by designing the overall cavity length to be a certain value since FSR is inversely proportional to cavity length. In optimizing the dG to be small, the FSR, the laser output power fluctuations, as well as the mode-partition noise are minimized for mode-hop transitions between m−1 to m and m to m+1; thus a tolerable signal impairment on the link over wide temperature operation is effectively maintained.

The graph 220 is shown to include a curve 222 representing a local transfer function for the lasing cavity 100 of FIG. 1 achieved through the utilization of the wavelength filter 106 at time T1. As discussed above, the lasing cavity 100 is designed to allow the lasing cavity to experience some mode hops when the device temperature changes, and thus the curve 222 illustrates a mode transition from m to m−1. As shown in this figure, the wavelength filter 106 is selected such that when the mode-hop from m to m−1 takes place, the modal gain during the mode transition ($dG_1$) is within a predetermined delta value; in other words, the inter-cavity loss for the modes m and m−1 (and m+1) does not result in significant power fluctuations.

Thus, the curves 202 and 222 illustrate the local transfer function for the lasing cavity 100 is relatively flat for adjacent modes m−1, m, and m+1; in other words, the gain difference across the wavelengths for the modes m−1, m, and m+1 is minimal, producing a relatively flat curve for these wavelength values as shown in the curves 202 and 222. Thus, the wavelength filter 106 is designed and stabilized to produce a local transfer function for the lasing cavity such that the potential drift is limited.

In some embodiments, the phase of the light generated by partially stabilized lasing cavities as described above may vary randomly due thermal changes in non-stabilized components (e.g., components outside the region 110 of FIG. 1). This can cause interference between the modes, which produces a beating effect in the laser output, leading to fluctuations in the intensity of the output. In some embodiments, a lasing cavity is designed in length to be short enough so that just as a mode transition occurs, the noise peak is outside of the data band so that it is not affecting the expected signal to noise ratio (SNR). In some embodiments, a phase control section may be utilized to further control the output of a lasing cavity.

Figure 3:
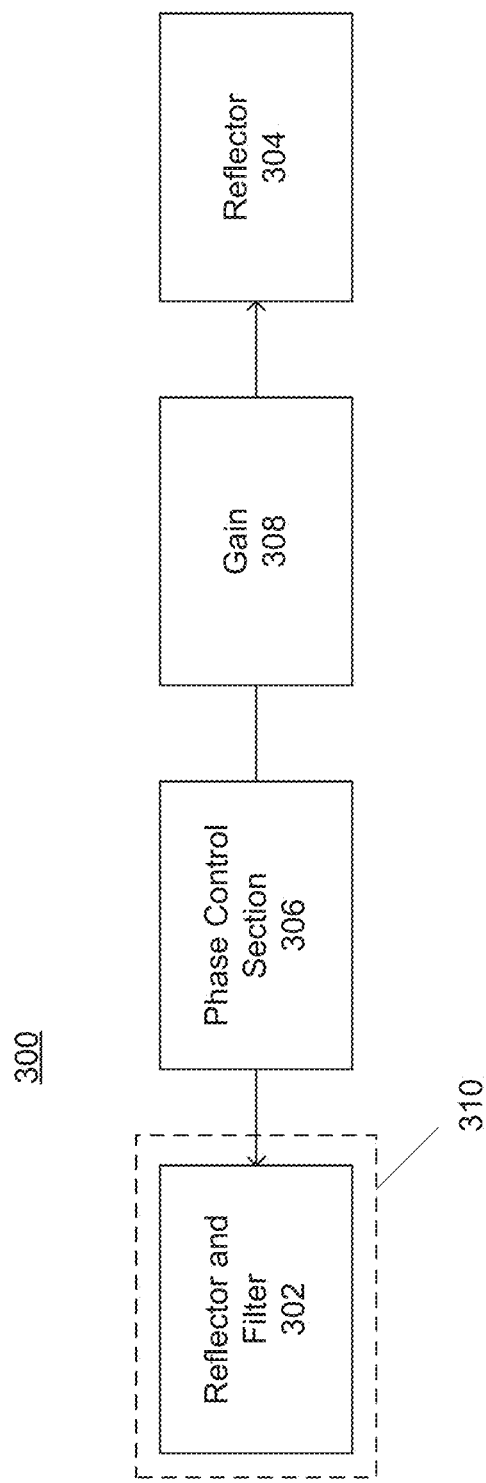
FIG. 3 is a block diagram of a lasing cavity of a device according to an embodiment of the disclosure.

FIG. 3 is a block diagram of a lasing cavity of a device according to an embodiment of the disclosure. In this embodiment, a device is shown to include a cavity 300 formed by reflectors 302 and 304, wherein the reflector 302 includes a wavelength filter. The wavelength filter included in reflector 302 is hereby understood as the element(s) that achieves the wavelength selection in the lasing cavity 300. For example, the reflector and filter 302 may comprise a ring filter, and the reflector 304 may comprise a distributed Bragg reflector (DBR), such as a chirped grating (i.e., a grating having a pitch that varies continuously along its length, wherein each of chirped grating section reflects over a range of wavelengths); in this example, the ring filter can be a higher order filter to help the local transfer function for the lasing cavity 300 be aligned with the characteristics described above with respect to FIG. 2.

In this embodiment, the reflector 302 including the internal cavity wavelength filter is temperature stabilized, while the rest of the lasing cavity 300 is not temperature stabilized over the entire temperature operational range of the device. In the illustrated embodiment of FIG. 3, the region 310 including the reflector 302 (which further includes the wavelength filter of the lasing cavity 300) may be actively temperature stabilized using any temperature controlling device (e.g., thermoelectric coolers, microheaters, etc.), or may be passively stabilized by design.

Because the lasing cavity 300 is not entirely stabilized, as the temperature of the device varies, the cavity mode of the lasing cavity 300 may drift relative to the stable wavelength filter included in the reflector 302; thus a mode-transition may take place as the threshold modal loss of a neighboring cavity mode becomes smaller than the current laser mode. The phase control section 306 is used in this embodiment to tune the phase of the laser mode. In addition to adjusting the phase of the lasing output of the lasing cavity 300 to compensate for thermal changes in the non-stabilized components of the lasing cavity 300, controlling the phase of the laser mode can reduce the number of mode-hops the laser undergoes over time, as the cavity mode is allowed to be stabilized over some limited temperature fluctuations. In other words, the phase control section 306 can be used to stabilize the wavelength associated with longitudinal modes allowed by the utilized wavelength filter.

Furthermore, the phase control section 306 can be used to actively induce a mode-transition, for example, through utilizing a faster or slower phase-tuner as compared to the inherent thermal response of the thermal mass of the lasing cavity 300 with respect to environmental changes, or by using a non-trivial drive signal (e.g., a pre-emphasis drive signal). Tuning the mode transition of a device avoids conditions where the chip temperature is such that the laser would operate very close to or in a mode-hop transition for an extended period of time.

Figure 4:
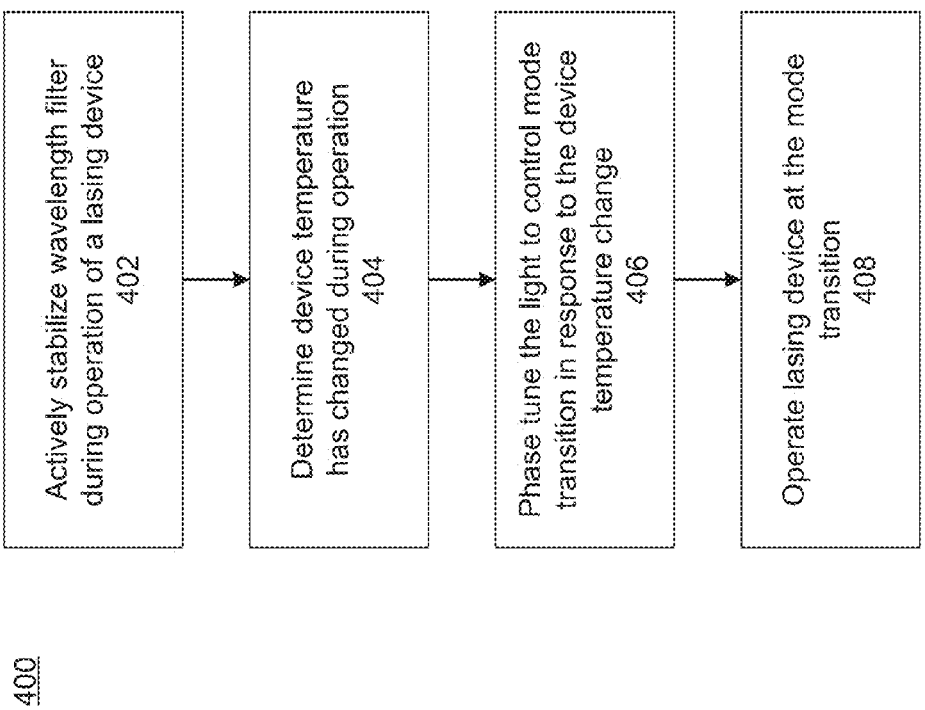
FIG. 4 is a flow diagram of a process for operating a lasing device according to an embodiment of the disclosure.

Utilizing a phase-tuner such as phase control section 306 inside the lasing cavity 300 allows the lasing device to be operated such that the entire thermal mass of the lasing cavity 300 is stabilized (stabilizing the output frequency of the laser) over a temperature range that is less than the total operational temperature range of the chip (i.e., a subset of the total operational temperature range of the chip). FIG. 4 is a flow diagram of a process for operating a lasing device according to an embodiment of the disclosure.

Flow diagrams as illustrated herein provide examples of sequences of various process actions. Although the actions are shown in a particular sequence or order, unless otherwise specified, the order of the actions can be modified. Thus, the described and illustrated implementations should be understood only as examples. The illustrated actions can be performed in a different order, and some actions can be performed in parallel. Additionally, one or more actions can be omitted in various embodiments; thus, not all actions are required in every implementation. Other process flows are possible.

In this embodiment, process 400 includes executing an operation for actively stabilizing a wavelength filter included in a lasing cavity during operation of a lasing device (block 402). The wavelength filter may be actively stabilized via the use of a thermo-electric cooler, a microheater, etc.; in other embodiments, said wavelength filter may be passively stabilized, and thus no active stabilization operation may be executed. As discussed above, a lasing cavity with partial temperature stabilization allows the lasing cavity to experience some mode hops when the device temperature changes; however, because the wavelength filter 106 is stabilized, the cavity drift due to these mode hops is within a limited range.

An operation is executed to determine a device temperature change during its operation (block 404). Any process to determine the temperature of the lasing device may be used. For example, a highly stable resistive temperature device (RTD) may be used to measure the temperature within the non-stabilized portions of the lasing cavity, or highly stable thermal sensors may be used provide a stable wavelength reference for the wavelength of the generated laser light to detect changes due to temperature fluctuations. In other embodiments, the power of the generated laser light may be measured (e.g., at a monitor photodetector), and the measured power may be used to deduce that a temperature change as likely occurred.

An operation is executed to phase tune the light in response to the temperature change (block 406). As the temperature approaches the lower or upper limit of the allocated stabilization range, the cavity mode can be tuned by a phase control section to $2\pi$ relative to the fully stabilized internal wavelength filter, thus forcing a mode-transition. A technical benefit of controlling a mode transition is that the number of mode-hops the laser undergoes over time can be made lower since the cavity mode is allowed to be stabilized over some limited temperature fluctuations.

Another technical benefit of actively inducing a mode-transition is that the rate of the cavity mode phase tuning in relation to the wavelength filter can be controlled, for example, through utilizing a faster or slower phase-tuning rate as compared to the inherent thermal response of the lasing cavity thermal mass with respect to environmental changes, or by using a non-trivial drive signal (e.g., a pre-emphasis drive signal). A benefit of controlling a mode transition to a slower tuning rate is that a power loop can help stabilize output power. A benefit of controlling a mode transition to a faster tuning very close to the mode-transition is that less time is spent in the region close to the mode-transition where laser performance can be degraded.

An operation is executed to operate the lasing device at the mode transition (block 408). In some embodiments, in order to offset interference between the modes (caused by mode beat effects in the laser output, leading to fluctuations in intensity), a gain region of the lasing device can be controlled to increase the gain of the signal so that it is still detected at a respective receiver. For example, a receiver may utilize a notch filter to attenuate received signals with the increased gain.

Figure 5:
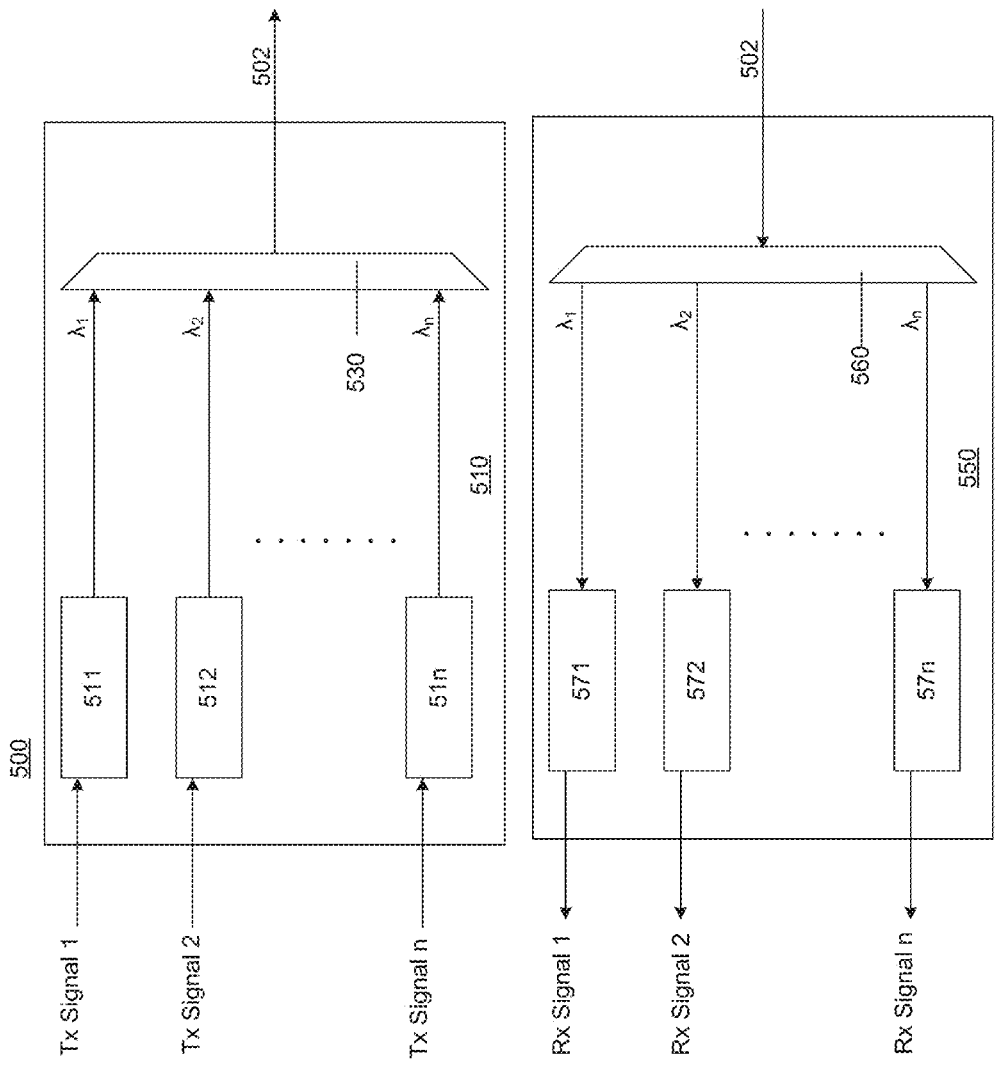
FIG. 5 illustrates a multi-wavelength optical transmitter and receiver according to an embodiment of the disclosure.

FIG. 5 illustrates a multi-wavelength optical transmitter and receiver according to an embodiment of the disclosure. Optical fiber transmission systems may use optical WDM transmitters, receivers, and/or transceivers to transmit and receive data by combining a number of different optical channels or signals at different WDM wavelengths onto a single fiber. Light at these WDM wavelengths is modulated as optical signals at different WDM wavelengths to carry different signal data. A system 500 is shown to comprise a multi-wavelength WDM transmitter module 510 and a WDM receiver module 550, each of with may be included in an optical device in a compact platform that allows multiple streams of data to be simultaneously placed on a one or more physical input and output (I/O) ports using multiple optical WDM wavelengths from an array of lasers operated at the optical WDM wavelengths.

In this embodiment, the transmitter module 510 generates an output WDM signal 502 having n different WDM wavelengths. These different WDM wavelengths may be based, for example, on, the L, C and S bands for WDM applications. Transmitter module 510 includes tunable laser modules 511-51$n$ to generate light, which may be further modulated based on transmission signal data. Said laser modules and modulators may be integrated or discrete components (not shown). A multiplexer 530 is shown to receive n modulated signals and outputs the WDM signal 502 that comprises multiple output channels within a WDM spectral band.

The receiver module 550 includes a de-multiplexer 560 to receive the WDM signal 502 and output the received signal at different WDM wavelengths along n different optical paths. In this embodiment, optical detectors 571-57$n$ are included in the n optical paths and convert the de-multiplexed signals of the WDM signal 502 into n reception data signals for further processing.

For the WDM transmitter module 510, if any of the tunable laser modules 511-51$n$ cavity drift in wavelength as discussed above, the signals generated by the laser modules can drift out of their wavelength channels. The tunable laser modules 511-51$n$ of the WDM transmitter module 510 may each comprise the lasing devices including the partially temperature stabilized cavities described above, and thus, may each experience a controlled modal drift as described above. Signals from the tunable laser modules 511-51$n$ may be further modulated based on transmission signal data. In some embodiments, modulator drive signals may be tailored to have excess gain at the frequencies which has some elevated relative intensity noise (RIN) (i.e., RIN peaks), thus improving the otherwise degraded SNR at those frequencies. In some embodiments, a complimentary filtering to this modulator drive signal is performed at the WDM receiver module 550 to flatten the overall link gain in frequency and suppressing the specific RIN peaks.

In some embodiments, the phase of the light generated by partially stabilized lasing cavities as described above may vary randomly due thermal changes in non-stabilized cavity components (e.g., components outside the region 110 of FIG. 1 and region 310 of FIG. 3). This can cause interference between the modes, which can in turn produce a beating effect in the laser output, leading to fluctuations in the intensity of the output. In some embodiments, a lasing cavity is designed in length to be short enough so that, just as a mode transition occurs, the noise peak is outside of the data band so that it is not affecting the expected SNR of the WDM signal 502 received at the WDM receiving module 550.

In another embodiment, the group delay of the laser cavity modes is designed such that the FSR of the cavity modes of the tunable laser modules 511-51*n* of the WDM transmitter module 510 are larger than the data bandwidth of the WDM receiver module 550—i.e., the bandwidth of the detectors 571-57*n*. In this embodiment, the photon-photon interaction between neighboring modes (as typically will be very strong in the case when dG is small) and the resulting beat tone between the modes (i.e., the RIN peak) may be filtered out in the optical detectors 571-57*n* of the WDM receiver 570 and thus not degrade the bit-error performance of the WDM signal 502.

Reference throughout the foregoing specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout the specification are not necessarily all referring to the same embodiment. Furthermore, the particular features, structures, or characteristics can be combined in any suitable manner in one or more embodiments. In addition, it is to be appreciated that the figures provided are for explanation purposes to persons ordinarily skilled in the art and that the drawings are not necessarily drawn to scale. It is to be understood that the various regions, layers, and structures represented in the figures can vary in size and dimensions.

The above described embodiments can comprise silicon on insulator (SOI) or silicon-based (e.g., silicon nitride (SiN)) devices, or can comprise devices formed from both silicon and a non-silicon material. Said non-silicon material (alternatively referred to as "heterogeneous material") can comprise one of III-V material, magneto-optic material, or crystal substrate material.

III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V-based materials can be significantly higher than in silicon-based materials, as electron speed in III-V semiconductors is much faster than that in silicon semiconductors. In addition, III-V materials have a direct bandgap which enables efficient creation of light from electrical pumping. Thus, III-V semiconductor materials enable photonic operations with an increased efficiency over silicon for both generating light and modulating the refractive index of light.

Thus, III-V semiconductor materials enable photonic operation with an increased efficiency at generating light from electricity and converting light back into electricity. The low optical loss and high quality oxides of silicon are thus combined with the electro-optic efficiency of III-V semiconductors in heterogeneous optical devices; in some embodiments, said heterogeneous devices utilize low-loss heterogeneous optical waveguide transitions between the devices' heterogeneous and silicon-only waveguides.

Magneto-optic materials allow heterogeneous PICs to operate based on the magneto-optic (MO) effect. Such devices can utilize the Faraday effect, in which the magnetic field associated with an electrical signal modulates an optical beam, offering high bandwidth modulation, and rotates the electric field of the optical mode, enabling optical isolators. Said magneto-optic materials can comprise, for example, materials such as iron, cobalt, or yttrium iron garnet (YIG).

Crystal substrate materials provide heterogeneous PICs with a high electro-mechanical coupling, linear electro optic coefficient, low transmission loss, and stable physical and chemical properties. Said crystal substrate materials can comprise, for example, lithium niobate ($LiNbO_3$) or lithium tantalate ($LiTaO_3$).

In the foregoing detailed description, the method and apparatus of the present subject matter have been described with reference to specific exemplary embodiments thereof. It will, however, be evident that various modifications and changes can be made thereto without departing from the broader spirit and scope of the present disclosed subject matter. The present specification and figures are accordingly to be regarded as illustrative rather than restrictive.

Embodiments of the disclosure described a laser comprising a gain section, a wavelength filter, a first reflector, and a second reflector to form a laser cavity with the first reflector, the laser cavity to include the gain section and the wavelength filter. The wavelength filter is temperature stabilized within a predetermined temperature range and the remaining portions of the laser cavity are not temperature stabilized, and wherein the wavelength filter, when at the predetermined temperature range, comprises a plurality of adjacent longitudinal modes such that cavity round-trip modal gain values associated with each of the adjacent longitudinal modes comprise similar values differing by a predetermined delta.

In some embodiments, the wavelength filter comprises at least one of a grating, a ring filter, an asymmetric Mach Zehnder interferometer (MZI), or a directional coupler. In some embodiments, the wavelength filter is included in the first reflector or the second reflector. In some embodiments, the wavelength filter is included in the first reflector and comprises a ring filter to suppress a first set of longitudinal modes, and the second reflector comprises a distributed Bragg reflector (DBR) to suppress a second set of longitudinal modes.

In some embodiments, the laser further comprises a phase control section included in the laser cavity, the phase control section to adjust the phase of an output signal of the laser cavity in response to detecting temperature changes in the portions of the laser cavity not temperature stabilized. In some embodiments, the phase control section comprises at least one of a resistive element thermal tuner, a current injection PIN semiconductor diode, or a reverse bias semiconductor PIN diode.

In some embodiments, the gain section is to increase the gain of an output signal of the laser during a transition from a first longitudinal mode of the adjacent longitudinal modes to a second longitudinal mode of the adjacent longitudinal modes. In some embodiments, the gain section is to further increase signal power at noise peaks from a first longitudinal mode and adjacent longitudinal modes of the laser device.

Embodiments of the disclosure describe a method comprising detecting a temperature change during operation of a lasing device, and tuning the phase of an output signal of the lasing cavity in response to the temperature change. The lasing device comprises a gain section, a phase control section, a wavelength filter, a first reflector, and a second reflector to form a lasing cavity with the first reflector, the lasing cavity to include the gain section and the wavelength filter. The wavelength filter is temperature stabilized within a predetermined temperature range and the remaining portions of the lasing cavity are not temperature stabilized, and wherein the wavelength filter, when at the predetermined temperature range, comprises a plurality of adjacent longitudinal modes such that cavity round-trip modal gain values associated with each of the adjacent longitudinal modes comprise similar values differing by a predetermined delta.

In some embodiments, the wavelength of the output signal of the lasing cavity is tuned to transition the output signal from a first longitudinal mode of the adjacent longitudinal modes to a second longitudinal mode of the adjacent longitudinal modes. In some embodiments, the phase of the output signal of the lasing cavity is tuned to accelerate the transition of the output signal from the first longitudinal mode to the second longitudinal mode. In some embodiments, the phase of the output signal of the lasing is tuned to slow the transition of the output signal from the first longitudinal mode to the second longitudinal mode.

In some embodiments, the method further comprises actively stabilizing the wavelength filter by adjusting at least one of a thermo-electric cooler or a microheater disposed near the wavelength filter. In some embodiments, the method further comprises increasing the gain of the output signal of the lasing cavity during a transition from a first longitudinal mode of the adjacent longitudinal modes to a second longitudinal mode of the adjacent longitudinal modes. In some embodiments, the method further comprises increasing a power of the output signal at noise peaks from a first longitudinal mode and adjacent longitudinal modes of the laser device.

Embodiments of the disclosure describe a system comprising a receiver module and a transmitter module to generate an output signal to be received by the receiving module. The transmitter module is to include a laser device to generated the output signal and comprising a gain section, a phase control section, a wavelength filter, a first reflector, and a second reflector to form a laser cavity with the first reflector, the laser cavity to include the gain section and the wavelength filter. The wavelength filter is temperature stabilized within a predetermined temperature range and the remaining portions of the laser cavity are not temperature stabilized, and wherein the wavelength filter, when at the predetermined temperature range, comprises a plurality of adjacent longitudinal modes such that cavity round-trip modal gain values associated with each of the adjacent longitudinal modes comprise similar values differing by a predetermined delta.

In some embodiments, the gain section of the laser device of the transmitter module is to increase the gain of the output signal during a transition from a first longitudinal mode of the adjacent longitudinal modes to a second longitudinal mode of the adjacent longitudinal modes. In some embodiments, the receiver module includes a filter to filter noise peaks from a first longitudinal mode and adjacent longitudinal modes of the laser device included in the output signal received from the transmitter module. In some embodiments, the transmitter module increases the signal power at the noise peaks from a first longitudinal mode and adjacent longitudinal modes of the laser device.

In some embodiments, the laser cavity of the laser device of the transmitter module comprises a length to generate a noise peak in the output signal during a transition from a first longitudinal mode of the adjacent longitudinal modes to a second longitudinal mode of the adjacent longitudinal modes, and wherein the noise peak is outside of a data band of the receiver module. In some embodiments, the receiver module comprises a photodetector to receive the output signal from the transmitter module, wherein a full spectral range (FSR) of longitudinal modes of the laser cavity of the laser device of the transmitter module is larger than a bandwidth of the photodetector of the receiver module.

The invention claimed is:

1. A laser, comprising:
 a first reflector;
 a second reflector forming a laser cavity with the first reflector, the first and second reflectors having a separation that defines a free spectral range (FSR) of the laser cavity;
 a temperature-stabilized wavelength filter configured to spectrally filter light propagating in the laser cavity, the temperature-stabilized wavelength filter having a flat wavelength response for wavelengths within a range centered about a center wavelength and having a width of at least twice the FSR of the laser cavity, for temperatures within a specified range of temperatures.

2. The laser of claim 1, further comprising a gain region disposed within the laser cavity.

3. The laser of claim 2, wherein:
 a roundtrip modal gain of the cavity includes a gain from the gain region, minus a loss from the first reflector, minus a loss from the second reflector, minus a loss from the temperature-stabilized wavelength filter; and
 the roundtrip modal gain of the cavity is flat for wavelengths within the range centered about the center wavelength and having the width of at least twice the FSR of the laser cavity.

4. The laser of claim 3, wherein the flat wavelength response of the temperature-stabilized wavelength filter comprises a roundtrip modal gain within a specified range of roundtrip modal gains.

5. The laser of claim 2, further comprising an active temperature stabilizer configured to:
 keep the temperature-stabilized wavelength filter within the specified range of temperatures, and
 allow a first region of the laser cavity away from the temperature-stabilized wavelength filter to have a temperature outside the specified range of temperatures.

6. The laser of claim 5, further comprising a phase control section included in the laser cavity and configured to adjust the phase of an output signal of the laser cavity in response to a determined temperature change proximate the first region of the laser cavity.

7. The laser of claim 6, wherein the phase control section comprises at least one of a resistive element thermal tuner, a current injection PIN semiconductor diode, or a reverse bias semiconductor PIN diode.

8. The laser of claim 5, wherein the active temperature stabilizer comprises at least one of a thermo-electric cooler or microheater.

9. The laser of claim 2, wherein the gain region is configured to increase the gain of an output signal of the laser during a transition from a first longitudinal mode of the adjacent longitudinal modes to a second longitudinal mode of the adjacent longitudinal modes.

10. The laser of claim 9, wherein the gain region is further configured to increase signal power at noise peaks from a first longitudinal mode and adjacent longitudinal modes of the laser device.

11. The laser of claim 1, wherein the temperature-stabilized wavelength filter comprises at least one of a grating, a ring filter, an asymmetric Mach Zehnder interferometer (MZI), or a directional coupler.

12. The laser of claim 1, wherein the temperature-stabilized wavelength filter is included in the first reflector or the second reflector.

13. The laser of claim 12, wherein the temperature-stabilized wavelength filter is included in the first reflector and comprises a ling filter to suppress a first set of longitudinal modes, and the second reflector comprises a distributed Bragg reflector (DBR) to suppress a second set of longitudinal modes.

14. A laser, comprising:
a first reflector;
a second reflector forming a laser cavity with the first reflector, the first and second reflectors having a separation that defines a free spectral range (FSR) of the laser cavity;
a gain region disposed within the laser cavity; and
a temperature-stabilized wavelength filter configured to spectrally filter light propagating in the laser cavity;
wherein a roundtrip modal gain of the cavity includes a gain from the gain region, minus a loss from the first reflector, minus a loss from the second reflector, minus a loss from the temperature-stabilized wavelength filter;
wherein the roundtrip modal gain of the cavity is within a specified range of roundtrip modal gains for wavelengths within a range centered about a center wavelength and having a width of at least twice the FSR of the laser cavity, for temperatures within a specified range of temperatures.

15. The laser of claim 14, further comprising an active temperature stabilizer configured to:
keep the temperature-stabilized wavelength filter within the specified range of temperatures, and
allow a region of the laser cavity away from the temperature-stabilized wavelength filter to have a temperature outside the specified range of temperatures.

16. The laser of claim 14, further comprising a phase control section included in the laser cavity and configured to adjust the phase of an output signal of the laser cavity in response to a determined temperature change proximate at least one of the gain region, the first reflector, or the second reflector.

17. The laser of claim 16, wherein:
the phase control section comprises at least one of a resistive element thermal tuner, a current injection PIN semiconductor diode; or a reverse bias semiconductor PLN diode;
the active temperature stabilizer comprises at least one of a thermo-electric cooler or microheater; and
the temperature-stabilized wavelength filter comprises at least one of a grating, a ring filter, an asymmetric Mach Zehnder interferometer (MZI), or a directional coupler.

18. A system, comprising:
a receiver module; and
a transmitter module configured to generate an output signal receivable by the receiver module, the transmitter module including a laser configured to generate the output signal; the laser comprising:
a first reflector;
a second reflector forming a laser cavity with the first reflector, the first and second reflectors having a separation that defines a free spectral range (FSR) of the laser cavity;
a gain region disposed within the laser cavity; and
a temperature-stabilized wavelength filter configured to spectrally filter light propagating in the laser cavity;
wherein a roundtrip modal gain of the cavity includes a gain from the gain region, minus a loss from the first reflector, minus a loss from the second reflector, minus a loss from the temperature-stabilized wavelength filter;
wherein the roundtrip modal gain of the cavity is within a specified range of roundtrip modal gains for wavelengths within a range centered about a center wavelength and having a width of at least twice the FSR of the laser cavity, for temperatures within a specified range of temperatures.

19. The system of claim 18, further comprising an active temperature stabilizer configured to:
keep the temperature-stabilized wavelength filter within the specified range of temperatures, and
allow a first region of the laser cavity away from the temperature-stabilized wavelength filter to have a temperature outside the specified range of temperatures.

20. The laser of claim 19, further comprising a phase control section included in the laser cavity and configured to adjust the phase of an output signal of the laser cavity in response to a determined temperature change proximate the first region of the laser cavity.

* * * * *